United States Patent
Tan

(10) Patent No.: US 6,607,605 B2
(45) Date of Patent: Aug. 19, 2003

(54) CLEANING OF SEMICONDUCTOR PROCESS EQUIPMENT CHAMBER PARTS USING ORGANIC SOLVENTS

(75) Inventor: Samantha Tan, Union City, CA (US)

(73) Assignee: Chemtrace Corporation, Fremont, CA (US)

( * ) Notice: Subject to any disclaimer, the term of this patent is extended or adjusted under 35 U.S.C. 154(b) by 0 days.

(21) Appl. No.: 09/945,259

(22) Filed: Aug. 31, 2001

(65) Prior Publication Data

US 2002/0066466 A1 Jun. 6, 2002

Related U.S. Application Data

(60) Provisional application No. 60/229,615, filed on Aug. 31, 2000.

(51) Int. Cl.[7] .................................................. C23G 1/02
(52) U.S. Cl. ........................... 134/3; 134/2; 134/18; 134/19; 134/22.1; 134/22.19; 134/26; 134/30; 134/31; 134/34; 438/905
(58) Field of Search ........................... 134/2, 3, 18, 19, 134/22.1, 22.19, 26, 30, 31, 34; 438/905; 216/101, 103

(56) References Cited

U.S. PATENT DOCUMENTS

| | | | |
|---|---|---|---|
| 4,152,824 A | | 5/1979 | Gonsiorawski |
| 4,576,698 A | * | 3/1986 | Gallagher et al. .......... 118/715 |
| 5,129,958 A | * | 7/1992 | Nagashima et al. ........ 134/22.1 |
| 5,149,811 A | | 9/1992 | Ueyama et al. |
| 5,362,370 A | | 11/1994 | Van der Heijden |
| 5,607,514 A | * | 3/1997 | Takeda et al. .............. 134/107 |
| 5,690,751 A | * | 11/1997 | Hosel et al. ................. 134/30 |
| 5,861,064 A | * | 1/1999 | Oikari et al. ............ 134/22.15 |
| 5,951,779 A | | 9/1999 | Koyanagi et al. |
| 6,140,287 A | * | 10/2000 | Lee ............................. 510/175 |
| 6,379,575 B1 | * | 4/2002 | Yin et al. ..................... 134/1.1 |

FOREIGN PATENT DOCUMENTS

| | | | |
|---|---|---|---|
| EP | 0 571 015 A1 | | 11/1993 |
| JP | 06238242 | * | 8/1994 |
| JP | 10085683 | * | 9/1996 |
| JP | 409134897 A | | 5/1997 |

* cited by examiner

*Primary Examiner*—Randy Gulakowski
*Assistant Examiner*—M. Kornakov
(74) *Attorney, Agent, or Firm*—Perkins Coie LLP

(57) ABSTRACT

A system and method are provided for using an organic solvent to clean chamber parts used in semiconductor manufacturing. The chamber parts are exposed to the solvent using a dipping system or a vapor contact system in order to soften or dissolve the organic polymers. The solvent may be heated up to a temperature of 100° C. The organic cleaning solvent may be a pyrrole-based, amine-based, fluoro/ether-based or ether-based solvent. Additionally, a system and method are provided for establishing criteria to verify that the chamber parts are clean with respect to organic, metallic and particulate impurities and establishing criteria to verify that the physical surface morphology remains intact.

15 Claims, 6 Drawing Sheets

Cleaning of a chamber part by organic solvent vapor.

Cleaning of a chamber part by organic solvent dipping.

Flowchart for cleaning a chamber part by organic solvent dipping.

Cleaning of a chamber part by organic solvent vapor.

Flowchart for cleaning a chamber part by organic solvent vapor.

CLEANING OF SEMICONDUCTOR PROCESS EQUIPMENT CHAMBER PARTS USING ORGANIC SOLVENTS

CROSS REFERENCE TO RELATED APPLICATIONS

This application claims the benefit of provisional application U.S. Ser. No. 60/229,615, filed on Aug. 31, 2000, entitled "Cleaning of Semiconductor Process Equipment Chamber Parts Using Organic Solvents", incorporated herein by reference and is a continuation-in-part of U.S. Patent application entitled "System and Method for Cleaning Semiconductor Fabrication Equipment Parts", filed on Aug. 10, 2001, incorporated herein by reference.

FIELD OF THE INVENTION

The present disclosure relates to cleaning semiconductor process equipment and more particularly to the cleaning of processed organic polymer deposits using organic solvents.

BACKGROUND OF THE INVENTION

Most types of dry processing equipment used for the manufacture of semiconductor devices utilize processes involving high temperatures, plasmas and gaseous mixtures for film deposition and etching. During these manufacturing processes, organic and inorganic by-products are deposited on the surfaces of chamber parts. FIG. 1 shows a representative chamber 100 of the prior art used for film deposition and etching that contains deposited by-products 101 on the surfaces of chamber parts. The by-products of a dielectric etch equipment typically contain high concentrations of organic or photoresist-based based polymers and lower levels or metallic or inorganic impurities. Accumulation of these by-products on the surfaces of the chamber parts causes problems in semiconductor manufacturing such as contaminating wafers with particles and organic and metallic impurities. The manufacturing by-products can also interfere with proper semiconductor device manufacturing by altering or stopping process chemistries. As a result, after a certain number of wafers have been processed, these contaminated chamber parts must be removed for cleaning. Effective and appropriate cleaning procedures and recipes are critical in order to obtain clean chamber parts, maximum chamber performance and minimum equipment downtime. In addition, if incorrect cleaning procedures are used, chamber parts can be irreversibly damaged and the lifetime of the chamber parts is significantly shortened.

Previously, organic or photoresist-based polymer deposits were removed using grit blasting, scrubbing with abrasives and carbon dioxide ($CO_2$) blasting. FIG. 2 depicts a typical surface of a chamber part 200 after polymer deposits were subjected to grit blasting, abrasives, or $CO_2$ blasting of the prior art. These physical methods were ineffective in completely removing all organic polymers, leaving portions of organic polymers 202 on the chamber part surface, and resulting in physical damage to the surfaces of the chamber part, such as damaged area 201. As a result, the chamber parts cleaned by these physical methods performed poorly with respect to particles, organic and metallic impurities and often failed prematurely due to deterioration of the surface's integrity. Additionally, there is no practical way of determining what polymers remain on the chamber part surface after the grit blasting, abrasive or $CO_2$ process is performed and whether the integrity of the chamber part surface is compromised or damaged in some way by these physical process.

What is needed is a method and apparatus for completely removing all process organic polymer deposits from metal chamber part materials as well as metallic impurities such as Al, anodized Al, Ni, stainless steel, Ti, Cu, Cr and Fe. The cleaning method should, in addition to completely removing the organic polymers, also remove particles and metallic impurities without corroding, damaging or altering the original chamber part material and surface morphology. This cleaning procedure should also be applicable to ceramics ($Al_2O_3$ and SiC), quartz, glass and silicon.

Additionally, what is needed is to establish criteria to verify that the chamber parts are clean with respect to organic, metallic and particulate impurities and to establish criteria to verify that the physical surface morphology remains intact.

SUMMARY OF THE INVENTION

The present invention includes a system and method for cleaning chamber parts with an organic solvent. Preferably, the chamber parts are exposed to the solvent in order to soften or dissolve the organic polymers. The organic cleaning solvent may, for example, be a pyrrole-based, amine-based, or flouro/ether-based or glycol ether acetate-based solvents. This method may be used as a stand-alone method or in conjunction with other prior art methods such as $CO_2$ snow cleaning where that method is used as a pre-process step.

In one embodiment of the present invention, the system uses a solvent dipping method to expose the chamber parts to a liquid phase of the organic solvent. In this embodiment, the chamber part is dipped into a solvent tank containing the solvent. In one variation of this embodiment, the solvent is heated up to a temperature of about 60° C.

In another embodiment of the present invention, the system uses a vapor contact system to expose the chamber parts to the organic solvent. In this embodiment, the chamber part is contained within an enclosed environment with a solvent vapor. The chamber part is exposed to the solvent vapor and then cleaned. In one variation of this embodiment, the solvent vapor is heated up to a temperature of about 100° C.

An advantage of the vapor contact method is that a chamber part can be kept away from the cleaning solvent which may be saturated with dissolved polymers. This approach will minimize the build-up of polymer impurities in the cleaning solvent tank, and result in cleaner and stain-free chamber parts. The vapor cleaning process also greatly minimizes the amount of solvents used in the cleaning process.

The present invention provides a procedure and apparatus for completely removing all process organic polymer deposits from chamber part materials as well as metallic contaminants such as Al, anodized Al, Ni, stainless steel, Ti, Cu, Cr and Fe used in the making of chamber parts. The present invention also can be used to clean chamber part materials such as ceramics ($Al_2O_3$ and SiC), quartz, glass and silicon. The cleaning procedures and systems advantageously remove the organic and/or photoresist-based polymers without corrosion, damaging or altering the original chamber part material or surface morphology.

Additionally, the present invention establishes criteria to verify that the chamber parts are clean with respect to organic, metallic and particulate impurities and establishes criteria to verify that the physical surface morphology remains intact in terms of surface roughness, hardness, thickness and micro-structure.

DESCRIPTION OF THE PREFERRED EMBODIMENT

Figure 1:
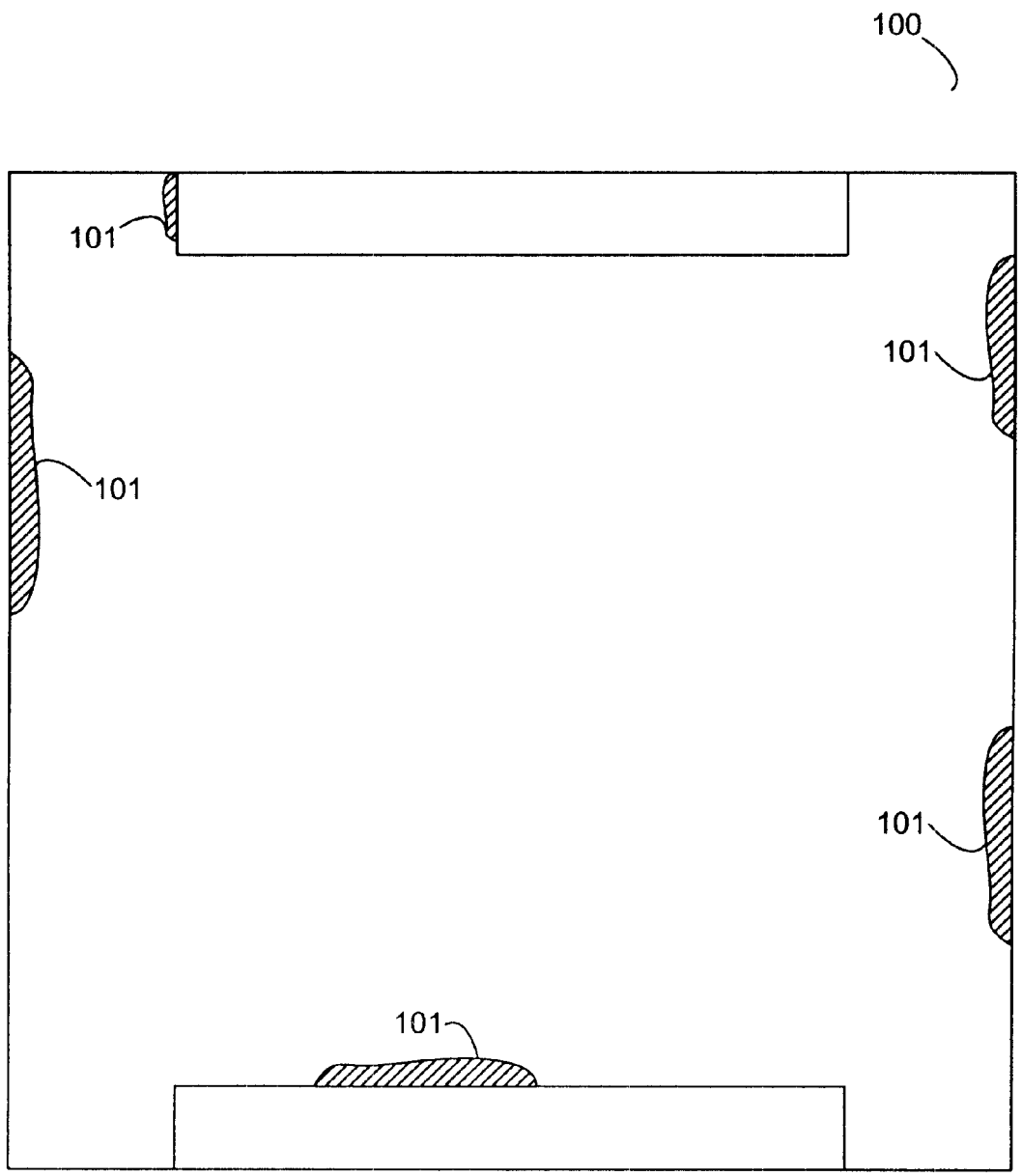
FIG. 1 is an illustration of a prior art film deposition and etching chamber containing deposited by-products.
Figure 2:
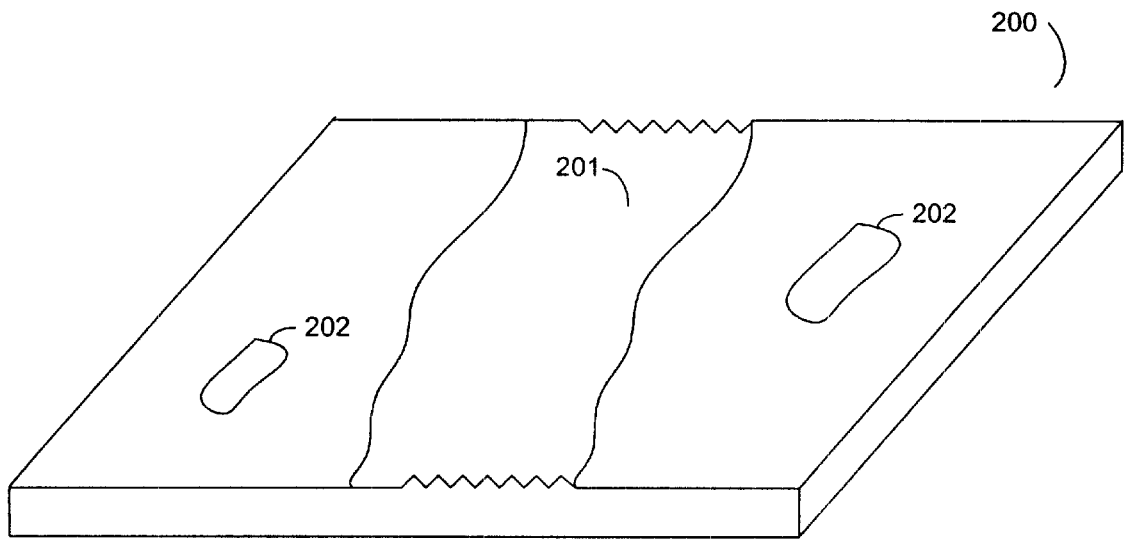
FIG. 2 is an illustration of a surface of a chamber part surface that was cleaned by a process of the prior art.

In a solvent cleaning process of the present invention, parts to be cleaned are wetted with organic solvents to soften and/or dissolve organic process polymers formed on surfaces of the parts. Softened organic polymers then can be removed from the chamber parts by a variety of methods, e.g. mechanical scraping.

In an embodiment of the invention, the removal of a softened polymer is accomplished by gently scraping or wiping the part with a wipe or plastic spatula (e.g. nylon) or with a soft abrasive and then by rinsing the part with de-ionized (DI) water, acetone and/or isopropanol. If the organic polymer is dissolved in the organic solvents, the chamber parts are then advantageously cleaned by rinsing with DI water, acetone and/or isopropanol after soaking in the organic solvents. Optionally, the part may also be dipped in a very dilute acid (e.g. less than about 5% nitric acid and preferably about 1 to 2% nitric acid) for removal of metal contamination without corroding the part.

In an embodiment of the invention, the organic cleaning solvent may be categorized as one of five category types. These five categories of organic cleaning solvents are effective for the removal of organic and photoresist-based process polymers. The solvents can be used in a pure form or in mixtures having various concentrations of solvents. The first category is pyrrole-based solvents such as n-methyl pyrrolidinone (NMP), alpha-pyrrolidinone, beta-pyrrolidinone, pyrrolidine and pyrrole. The second category is amine-based solvents such as hydroxlamine, ethylamine, methylamine, diethylamine and triethylamine. The third category is fluoro/ether-based solvents such as ethyl perfluoroisobutyl ether, ethyl perfluorobutyl ether, nonafluorobutyl methyl ether, nonafluoroisobutyl methyl ether, 1,1,1,2,3,4,4,5,5,5-decaflouorpentane. The fourth category is hydrocarbon ether-based solvents such as glycol ether, benzyl ether and the fifth category is glycol ether acetate based such as propylene glycol mono methyl ether acetate, and propylene glycol monomethyl ether.

All five category types of solvents are effective in the softening, dissolution and removal of the organic and photoresist-based process polymers from workpieces or "parts," such as semiconductor process chamber parts. However, it is important to select organic solvents that do not attack or corrode the chamber part materials. In particular, an organic solvent must be chosen that will not corrode the anodized layer and metal parts. Thus, in one embodiment of the invention, water-soluble solvents are used because they are capable of being easily rinsed off by DI water, acetone and/or isopropanol thus leaving a contamination and solvent-free surface on the chamber part. For metal chamber parts, immediate drying of the part after the completion of cleaning is important to prevent further corrosion or oxidation of part surfaces.

In addition, only organic solvents with low water content are used for anodized Al and metal surfaces. The presence of water in the organic solvent causes the formation of corrosive species such as HF and HCl from the hydrolysis of chloro or fluoro groups present in the organic polymers of a contaminated chamber part. These corrosive species even in small quantity can initiate corrosion and damage the metal chamber part materials. Therefore, neat (anhydrous) and high purity solvents such as NMP are especially favorable for cleaning organic polymer from the contaminated chamber parts. In the context of the present invention, it should be understood that the terms "neat" and "anhydrous" can be used interchangeably and refers to a material that is essentially free of moisture or has a very low water content (generally less than about 1% water).

It will therefore be appreciated that, broadly stated, a method for cleaning semiconductor fabrication equipment parts in accordance with the present invention includes providing a fluid organic solvent including at least one of pyrrole-based, amine-based, fluoro/ether-based, hydrocarbon ether-based and glycol ether acetate based solvents; and contacting the fluid organic solvent with a surface of a workpiece to be cleaned. Preferably, the fluid organic solvent has a low water content when an anodized aluminum metal part is to be cleaned. In one embodiment, the fluid organic solvent in contact with the part to be cleaned is in a liquid phase, in another embodiment the fluid organic solvent that contacts the part to be cleaned is in a vapor phase, and in still another embodiment the fluid organic solvent in contact with the part is partially in the liquid phase and partially in the vapor phase. In this third embodiment, for example, the part can be partially immersed in a liquid phase organic solvent while other portions of the part can be exposed to a vapor phase organic solvent.

The liquid organic solvent may be heated in a temperature range from above room temperature to about 100° C., although typically not more that to about 60° C. In another embodiment, the liquid organic solvent is at about room temperature (typically in the range of 20–25° C.).

Figure 3A:
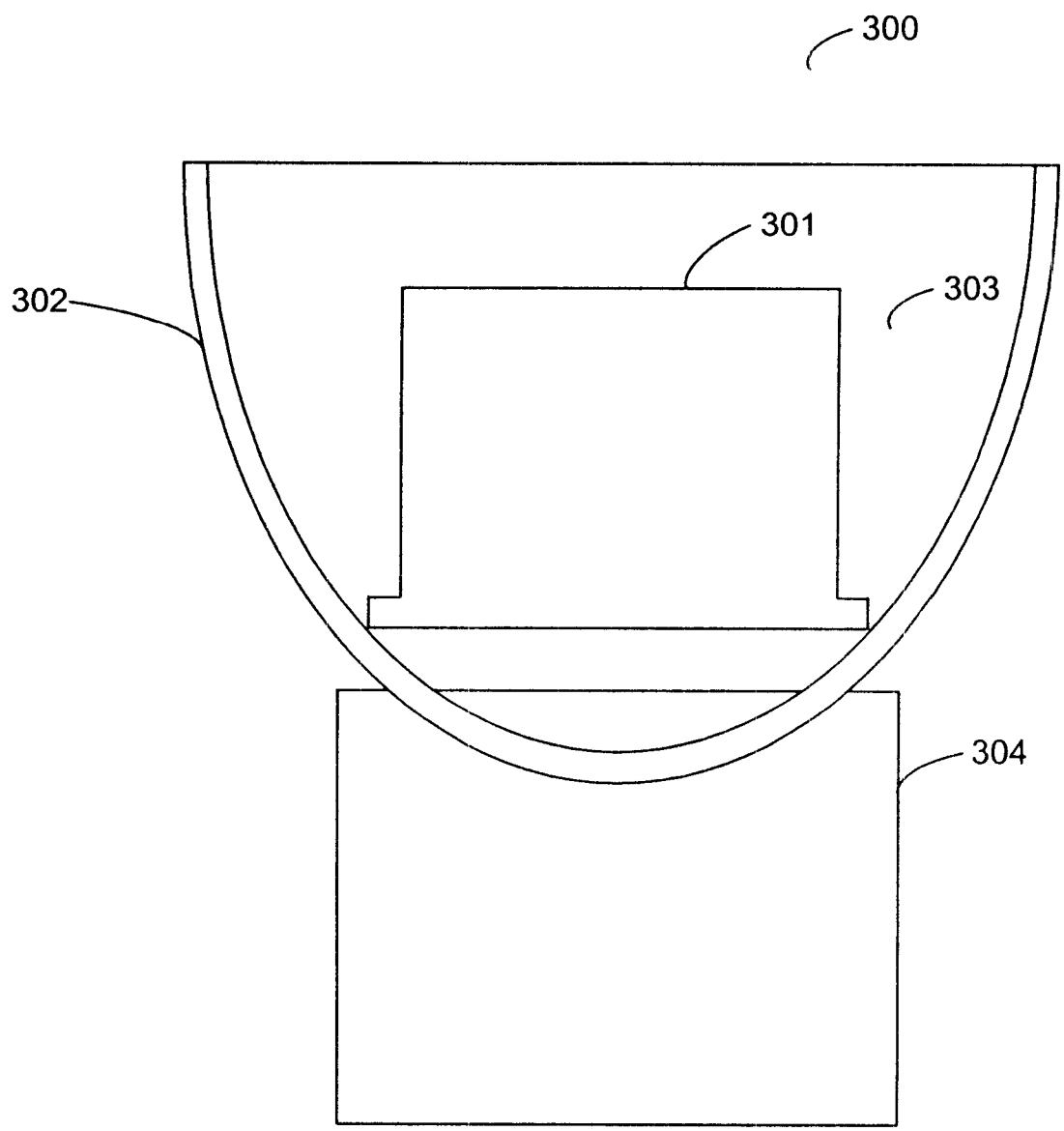
FIG. 3A is an illustration of an apparatus for cleaning a chamber part or other workpiece by organic solvent dipping in accordance with the present invention.

There are several ways of wetting the chamber parts with the organic solvents. For example, FIG. 3A illustrates a dipping system 300 for wetting the chamber parts according to one embodiment of the invention. The system 300 includes a contaminated chamber part 301 having organic residue located on its surface (not shown), a solvent container or "tank" 302, and an organic solvent 303 located within the solvent tank. As discussed above, the concentration of the organic solvent 303 may vary according to the particular polymer build-up on the chamber part and other factors such as the part material type and its reactivity with respect to the cleaning solvent. The terms "dipping" and "immersing" can be used interchangeably in the context of the present invention and is not limited to merely sticking an object into a liquid and pulling it out after a very short time span. "Immersing" can also range from an object (aka, for example, "part", or "chamber part", or "workpiece") being only partially submerged in the liquid to the object being completely submerged in a liquid.

It will therefore be appreciated that an apparatus for cleaning semiconductor fabrication equipment parts in accordance with the present invention includes a container or tank; an organic solvent disposed within the tank wherein the organic solvent is composed of at least one of pyrrole-based, amine-based, fluoro/ether-based, hydrocarbon ether-based and glycol ether acetate based solvents; and a heat source coupled to the tank whereby the organic solvent may be heated to above ambient or "room" temperature. In one preferred embodiment, the organic solvent is heated in a temperature range from above room temperature to about 60° C. In another embodiment, the certain, less volatile, organic solvents are heated in a temperature range from above room temperature to about 100° C.

Figure 3B:
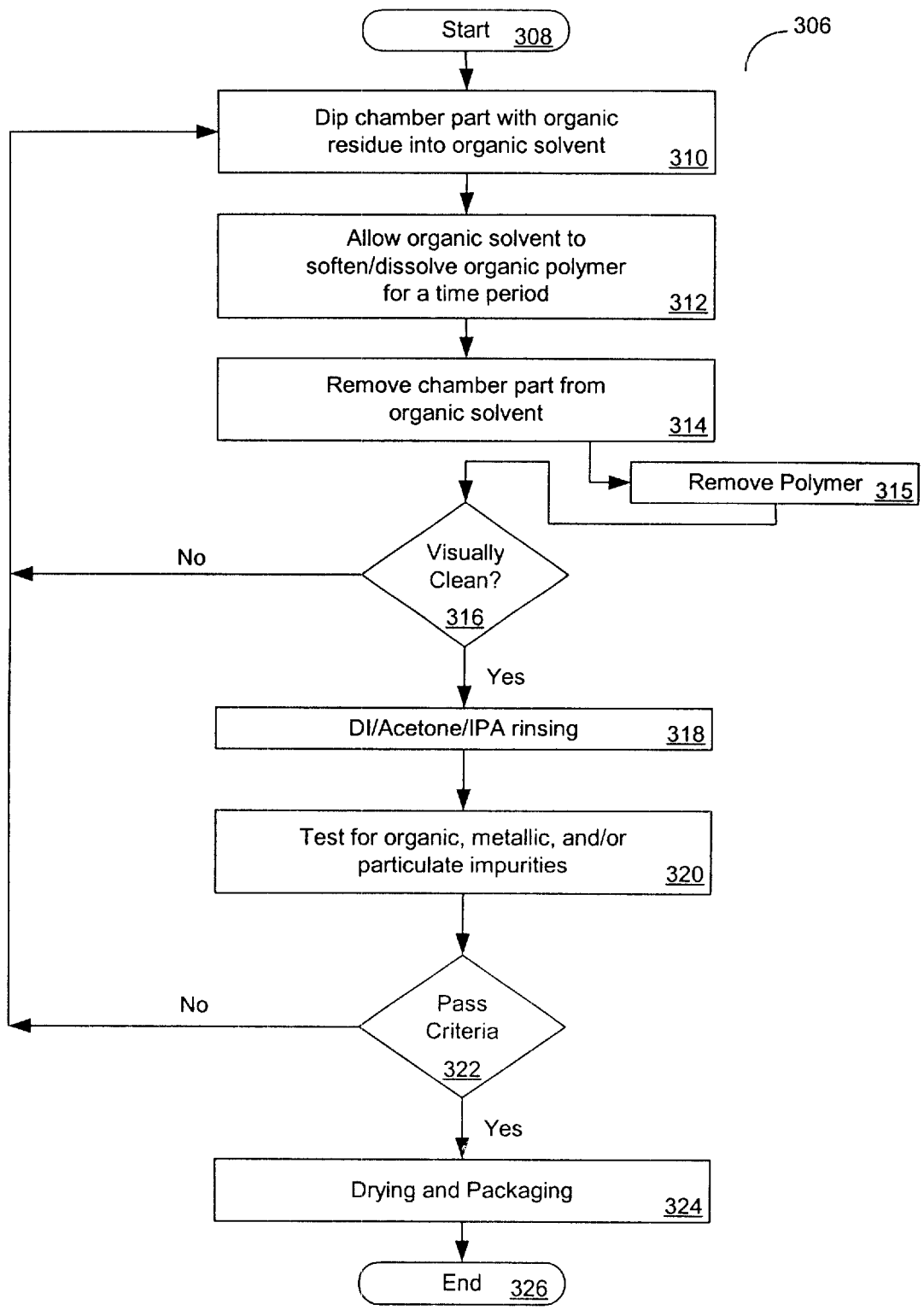
FIG. 3B is a flow chart illustrating a process for cleaning a chamber part by organic solvent dipping in accordance with the present invention.

FIG. 3B shows a process 306 for cleaning a chamber part, for example, by a "dipping" or "immersion" method. The process 306 starts at 308. In an operation 310, a chamber part with an organic residue is dipped into an organic solvent. Organic polymers are then dissolved and/or softened in an operation 312. The chamber part is removed from the organic solvent in an operation 314 and the organic polymer is removed using, for example, a wipe or plastic spatula or equivalent in an operation 315. The part is then visually inspected for cleanliness in an operation 316. Visual inspection can include using a traditional microscope. If the part does not look clean, operations 310, 312, 314, 315 and 316 are repeated. If the part looks clean, it is rinsed with DI (deionized) water, acetone and IPA (isopropyl alcohol) in an operation 318. The part is then tested for at least one of organic, metallic and particulate impurities in an operation 320. If proper cleanliness levels are not met, the part is re-dipped in an operation 310 and the process is repeated. If the part passes, it is dried and packaged in an operation 324. The process then ends at 326.

In a preferred embodiment, the criteria for a clean part includes, in addition to looking visually clean, testing the surface for organics and polymers. Carbon content testing on the part surface is a good indicator for this. A generally less than about $10^{14}$ carbon atoms/cm$^2$ result, as measured by DI water extraction followed by analysis by a total organic carbon analyzer (TOC) indicates that organics and polymers have been sufficiently removed. The criteria for a particle level test for most chamber part materials is generally less than about 300,000 particles/cm$^2$, as measured by DI water extraction followed by analysis with a liquid particle counter. Typically, at the present time, a particle size of about 0.05 microns or higher is used as a criteria particle size to test for using a liquid particle counter. The criteria for metallic impurities on metal parts is generally less than $10^{13}$ metal atoms/cm$^2$, depending on the base material as measured by acidic extraction followed by analysis with ICP-MS.

In one embodiment of the dipping system 300, the organic solvent is brought to a temperature within the range of about above room temperature and about 60° C. using a heat source such as heating coil or heat lamp 304. Again, "room temperature" is typically in the range of 20–25° C. In yet another embodiment involving solvent with a higher boiling point, the organic solvent cleaning temperature can be up to about 100° C. This improves the softening and dissolution rate of the organic process polymer and shorten the cleaning time of the chamber part.

It will therefore be appreciated that a process for cleaning semiconductor fabrication equipment parts in accordance with a preferred embodiment of the present invention includes: immersing a part into an organic solvent; removing the part from the organic solvent; inspecting the part for a presence of visible contaminants; re-immersing the part in the organic solvent if the inspection indicates the presence of visible contaminants; testing the part for a presence of non-visible contaminants; and re-dipping the part if the presence of non-visible contaminants is above an acceptable impurity level. In some instances, a polymer is removed from the part after the part is removed from the organic solvent. This polymer removal can be achieved, for example, by scraping the polymer off with a spatula. In other instances, the part is immersed in a dilute acid mixture to remove a presence of metallic contamination. For example, the metallic contamination removal can be accomplished in a separate dilute bath.

The non-visible contaminants can include one or more of organic, metallic and particulate impurities. In one embodiment, a preferred maximum impurity level for organic impurities is about $10^{14}$ carbon atoms/cm$^2$. In another embodiment, an acceptable maximum impurity level for particle impurities is about 300,000 particles/cm$^2$. In still another embodiment, an acceptable maximum impurity level for metallic impurities is about $10^{13}$ metal atoms/cm$^2$.

In some embodiments of the present invention, the organic solvent is heated in a temperature range from just above room temperature to about 100° C. In other embodiments, the organic solvent is heated in a temperature range from just above room temperature to about 60° C. In still another embodiment, the organic solvent is at about room temperature. Preferably, the organic solvent is comprised of at least one of pyrrole-based, amine-based, fluoro/ether-based, hydrocarbon ether-based and glycol ether acetate based solvents.

Figure 4A:
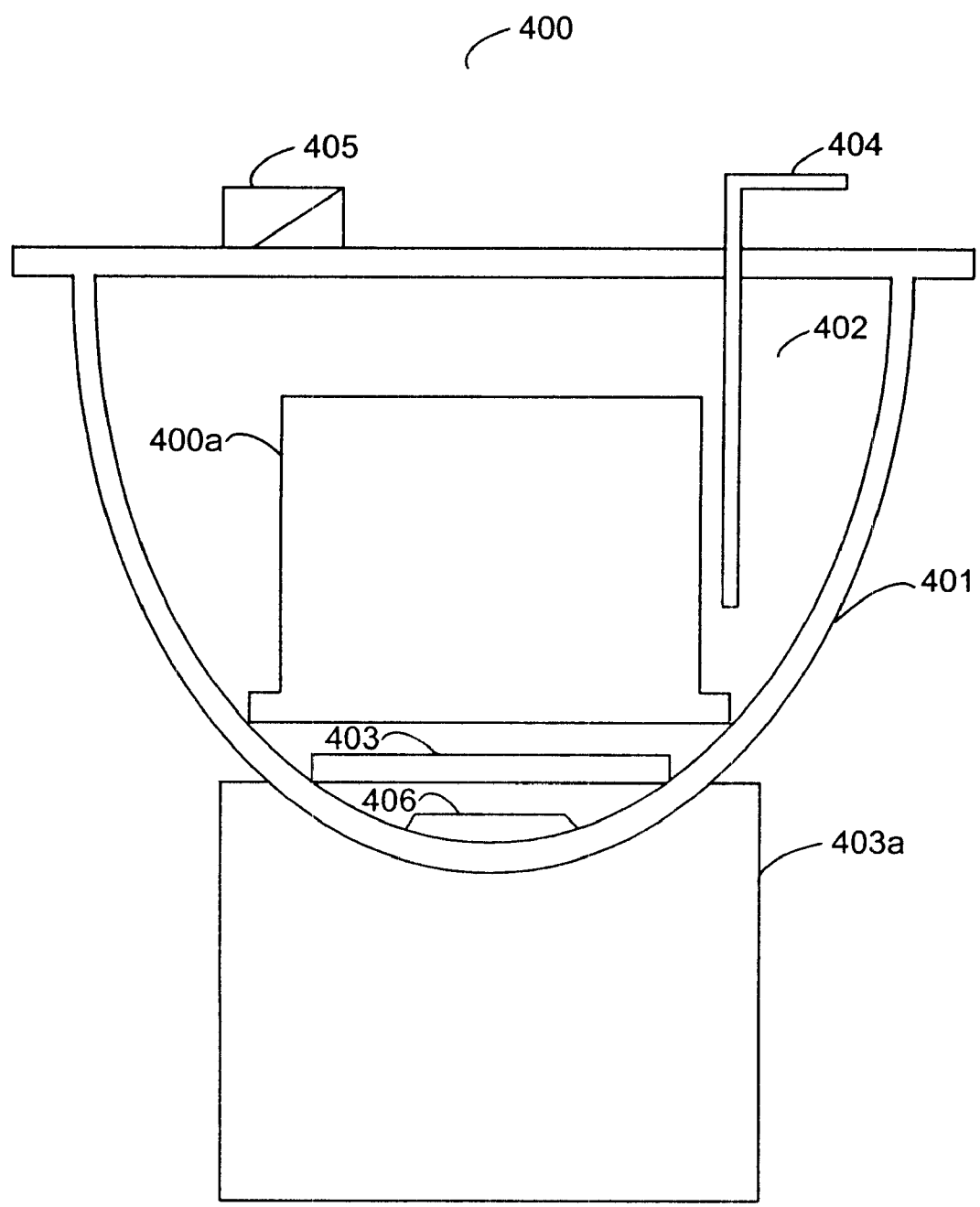
FIG. 4A is an illustration of an apparatus for cleaning a chamber part by exposing the chamber part to solvent vapor in an enclosed environment in accordance with the present invention.

FIG. 4A illustrates a vapor contact for wetting the chamber parts 301 according to another embodiment of the present invention. The vapor contact system 400 includes a contaminated chamber part 400a, a solvent vapor chamber 401 and a solvent vapor 402. The system 400 allows the chamber part surface to come into contact with the solvent vapor throughout the cleaning process and minimizes the amount of chemical being used in the cleaning process. The solvent vapor is generated by placing the part on a grate 403 over a solvent reservoir 406 with a heat source 403a. The vapor is produced from the solvent reservoir 406 in conjunction with the heat source 403a. The solvent vapor chamber is purged with an inert gas such as nitrogen through gas line 404 and corrosive gases are vented through an adjustable vent 405. The organic solvent vapor chamber is preferably vented and purged with high purity nitrogen at at least certain times during the cleaning process for the part. This procedure prevents the diffusion of atmospheric moisture into the chamber and also provides an inert non-oxidizing environment to prevent the corrosion of metal parts.

It will therefore be appreciated that an apparatus for cleaning semiconductor fabrication equipment parts with a vapor phase organic solvent includes: an enclosed container defining a chamber; a grate disposed within the chamber to hold a part; a purge inlet in fluid communication with the chamber; an exhaust outlet in fluid communication with the chamber; a liquid organic solvent reservoir; and a heat source thermally coupled to the liquid organic solvent reservoir to create a vapor organic solvent within the chamber. Preferably, the container and the grate are made out of quartz or fluoropolymers.

Figure 4B:
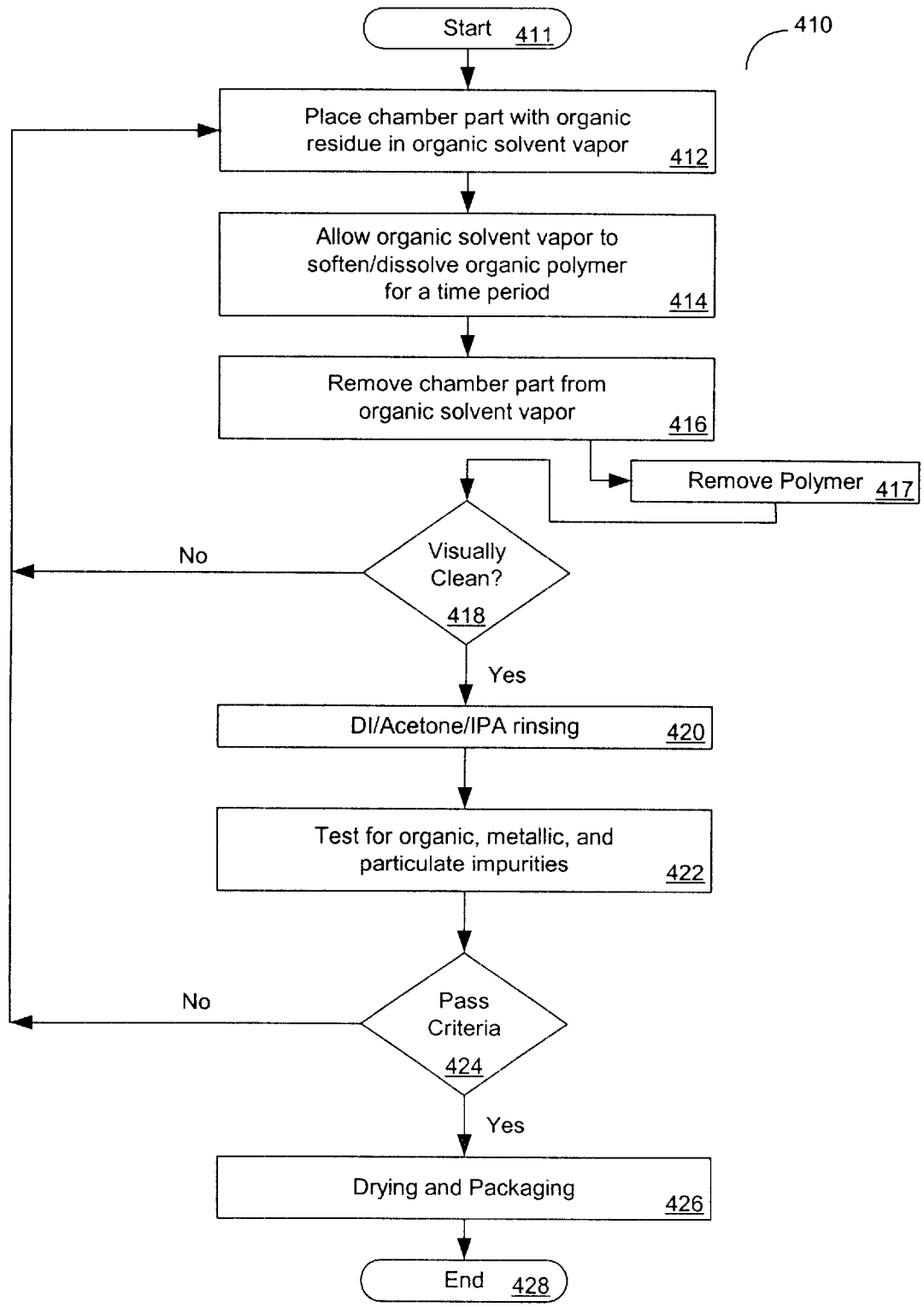
FIG. 4B is a flow chart illustrating a process for cleaning a chamber part by solvent vapor exposure within an enclosed container in accordance with the present invention.

FIG. 4B shows a process 410 for cleaning a chamber part by a vapor contact method of the present invention. The process 410 starts at 411 and, in an operation 412, a chamber part or other workpiece contaminated with organic residue is placed in an organic solvent vapor. The vapor then softens and/or dissolves the organic polymer/residue for a period of time in an operation 414. The part is then removed from the vapor in an operation 416 and the organic polymer is removed, for example, using a wipe or plastic spatula or equivalent in an operation 417. The part is inspected visually for cleanliness in an operation 418. Visual inspection can include using a traditional microscope. If the part looks unclean, operations 412, 414, 416 and 418 are repeated. If the part looks clean, it is rinsed using one or more of DI water, acetone and IPA in an operation 420. The part is then tested for at least one of organic, metallic and particulate impurities in an operation 422. If the part does not pass the testing criteria at operation 424, the process is repeated starting at operation 412. If the part passes, it is dried and packaged in an operation 426. The process then ends at 428.

During the exposure of the chamber parts to the organic solvent vapor, the organic solvent vapor chamber may be vented and purged with high purity nitrogen. This procedure prevents of the diffusion of atmospheric moisture into the chamber as well as it provides an inert non-oxidizing environment to prevent the corrosion of metal parts.

The same testing and test levels previously described can also be applied to the chamber part cleaned via the solvent vapor method.

In one embodiment of the vapor contact system 400, the liquid organic solvent is at a temperature within the range of about room temperature and about 60° C. Some liquid organic solvents provide sufficient vapor phase at about room temperatures, and others are heated to increase the amount of vapor phase. Typically, the higher the temperature, the higher the softening and dissolution rate of the organic process polymer being cleaned from the part. In yet another embodiment involving solvent with higher boiling points, the organic solvent vapor temperatures can be up to about 100° C.

It will therefore be appreciated that a process for cleaning semiconductor fabrication equipment parts by the vapor method includes: placing a part to be cleaned into a chamber; heating a liquid organic solvent to produce a vapor phase organic solvent within the chamber; purging the chamber; and removing the part from the chamber. The process also preferably includes inspecting the part for a presence of visible contaminants; and re-introducing the part to the organic solvent vapor if the inspection indicates the presence of visible contaminants. The process further preferably includes testing the part for a presence of non-visible contaminants; and re-introducing the part to the organic solvent vapor if the presence of non-visible contaminants is above an acceptable impurity level.

A polymer may be removed from the part after the part is removed from the organic solvent by, for example, scraping the polymer off with a spatula or the equivalent as described previously. Metallic contaminants can be removed by immersing the part in a dilute acid mixture. This can be accomplished, for example, in a separate dilute acid bath.

The non-visible contaminants can be one or more of organic, metallic and particulate impurities. An acceptable maximum impurity level for organic impurities is currently about $10^{14}$ carbon atoms/cm$^2$. An acceptable maximum impurity level for particle impurities is currently about 300,000 particles/cm$^2$. An acceptable maximum impurity level for metallic impurities is currently about $10^{13}$ atoms/cm$^2$.

In a further embodiment of the present invention, the part can be tested to determine that the physical surface morphology of the part is intact after a cleaning procedure is completed. After cleaning, the thickness of the anodized layer can be verified using a Fisherscope™ to determine if any significant reduction of the anodized layer thickness has occurred. In general, a reduction in the anodized layer thickness of about less than about 0.2 mils is acceptable. The surface roughness can also be measured by a surface profilometer. A change of less than about 50 Ra is considered an acceptable amount of surface roughness. Additionally, the surface morphology can be inspected using a SEM with Energy Dispersive X-ray detection (SEM/EDX). This inspection can be useful for verifying that no etching or damage to grain boundaries has occurred. It should be understood that in the context of the present invention, the term "morphology" refers to structure when used in conjunction with a particular object. For example, the morphology of a process part refers to the structure of the part itself.

The selection of the appropriate type of container, tank or chamber for the organic solvent or vapor cleaning systems of FIGS. 3A and 4A tends to be important. In a preferred embodiment, containers made from materials such as fluoropolymers and quartz are preferred. Other types of container materials such as polypropylene, polyethylene or metals may dissolve or corrode and can stain or contaminate chamber parts.

Having thus described illustrative embodiments of the invention, it will be apparent that various alterations, modifications and improvements will readily occur to those skilled in the art. Such obvious alterations, modifications and improvements, though not expressly described above, are nonetheless intended to be implied and are within the spirit and scope of the invention. Accordingly, the foregoing discussion is intended to be illustrative only, and not limiting; the invention is limited and defined only by the following claims and equivalents thereto.

What is claimed is:

1. A process for cleaning semiconductor fabrication equipment parts comprising:

placing a part to be cleaned into a chamber;

heating a liquid organic solvent to produce a vapor phase organic solvent within said chamber wherein said vapor phase of the organic solvent contacts said part to be cleaned purging said enclosed chamber with an inert gas; then and removing said part from said chamber.

2. A process of claim 1 further comprising:

inspecting said part for a presence of visible contaminants; and re-introducing said part to said organic solvent vapor if said inspection indicates said presence of visible contaminants.

3. A process of claim 2 further comprising:

testing said part for a presence of non-visible contaminants; and re-introducing said part to said organic solvent vapor if said presence of non-visible contaminants is above an acceptable impurity level.

4. A process of claim 1 further comprising removing a polymer from said part after said part is removed from said organic solvent.

5. A process of claim 4 wherein said polymer removal is achieved by scraping said polymer off with a spatula.

6. A process of claim 1 further comprising immersing said part in a dilute acid mixture to remove a presence of metallic contamination.

7. A process of claim 6 wherein said metallic contamination removal is done in a separate dilute bath.

8. A process of claim 3 wherein said presence of non-visible contaminants is comprised of at least one of organic, metallic and particulate impurities.

9. A process of claim 4 wherein an acceptable impurity level for organic impurities on said part is about less than about $10^{14}$ carbon atoms/cm$^2$.

10. A process of claim 4 wherein an acceptable impurity level for particle impurities on said part is about less than 300,000 particles/cm$^2$.

11. A process of claim 4 wherein an acceptable impurity level for metallic impurities on said part is about less than about $10^{13}$ atoms/cm$^2$.

12. A process of claim 1, 2 or 3 wherein said organic solvent is heated in a temperature range from above room temperature to about 100° C.

13. A process of claim 1, 2 or 3 wherein said organic solvent is heated in a temperature range from above room temperature to about 60° C.

14. A process of claim 1, 2 or 3 wherein said organic solvent is at about room temperature.

15. A process of claim 1, 2 or 3 wherein said organic solvent is comprised of at least one of pyrrole-based, amine-based, fluoro/ether-based, hydrocarbon ether-based and glycol ether acetate based solvents.

* * * * *